(12) United States Patent
Li et al.

(10) Patent No.: US 10,700,105 B2
(45) Date of Patent: Jun. 30, 2020

(54) ARRAY SUBSTRATE AND METHOD FOR MANUFACTURING THE SAME, DISPLAY PANEL AND DISPLAY DEVICE

(71) Applicants: BOE TECHNOLOGY GROUP CO., LTD., Beijing (CN); Ordos Yuansheng Optoelectronics Co., Ltd., Ordos, MN (US)

(72) Inventors: Yanfeng Li, Beijing (CN); Yanan Yu, Beijing (CN); Jingyi Xu, Beijing (CN); Xin Zhao, Beijing (CN); Xiaokang Wang, Beijing (CN); Yanwei Ren, Beijing (CN); Wei Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 16/131,959

(22) Filed: Sep. 14, 2018

(65) Prior Publication Data

US 2019/0164997 A1    May 30, 2019

(30) Foreign Application Priority Data

Nov. 28, 2017  (CN) ............................ 2017 1 1214162

(51) Int. Cl.
*H01L 27/12* (2006.01)
*G02F 1/133* (2006.01)

(52) U.S. Cl.
CPC ............ *H01L 27/124* (2013.01); *G02F 1/133* (2013.01); *H01L 27/1259* (2013.01)

(58) Field of Classification Search
CPC .... H01L 27/124; H01L 27/1259; G02F 1/133
See application file for complete search history.

(56) References Cited

U.S. PATENT DOCUMENTS

| | | | |
|---|---|---|---|
| 10,152,917 B2 * | 12/2018 | Chung | G09G 3/3225 |
| 2001/0032981 A1 | 10/2001 | Kong et al. | |
| 2005/0077524 A1 | 4/2005 | Ahn et al. | |
| 2017/0205668 A1 * | 7/2017 | Kim | G02F 1/133788 |
| 2017/0343866 A1 * | 11/2017 | Nam | G02F 1/134309 |

FOREIGN PATENT DOCUMENTS

CN        106842678 A        6/2017

OTHER PUBLICATIONS

First Chinese Office Action dated Nov. 19, 2019, received for corresponding Chinese Application No. 201711214162.5, 11 pages.

* cited by examiner

*Primary Examiner* — David Vu
(74) *Attorney, Agent, or Firm* — Kinney & Lange, P.A.

(57) ABSTRACT

An array substrate, a method for manufacturing an array substrate, a display panel and a display device are provided. The array substrate includes: a base substrate including a display area and a non-display area; a dummy data line in the non-display area of the base substrate; and an effective data line in the non-display area of the base substrate. The dummy data line is closer to an edge of the base substrate than the effective data line, and a width of the dummy data line is greater than a width of the effective data line.

18 Claims, 7 Drawing Sheets

ARRAY SUBSTRATE AND METHOD FOR MANUFACTURING THE SAME, DISPLAY PANEL AND DISPLAY DEVICE

CROSS-REFERENCE TO RELATED APPLICATION

This application claims the benefit of Chinese Patent Application No. 201711214162.5 filed on Nov. 28, 2017 in the State Intellectual Property Office of China, the whole disclosure of which is incorporated herein by reference.

TECHNICAL FIELD

The present disclosure relates to the field of display panel technologies, and in particular, to an array substrate, a method for manufacturing an array substrate, a display panel and a display device.

BACKGROUND

A narrow-bezel display has become a major development trend of high-quality displays due to its advantages such as simplicity, aesthetics, and large visible area with the same size. However, as the product bezel is gradually narrowed, it is required to route wirings on an array substrate more finely and more densely. When the wirings are routed in a SD data line layer of the narrow-bezel product, a size of a data line or a space between two adjacent data lines in a fanout wiring region is small, so that a weak connection or even a disconnection in the data lines is easy to occur during a process of forming the data lines. As a result, it is extremely easy to produce defects such as open circuit or the like, thereby resulting in lower product yields.

SUMMARY

In an aspect, an array substrate is provided. The array substrate may include: a base substrate including a display area and a non-display area; a dummy data line in the non-display area of the base substrate; and an effective data line in the non-display area of the base substrate, wherein the dummy data line is closer to an edge of the base substrate than the effective data line, and a width of the dummy data line is greater than a width of the effective data line.

Optionally, the dummy data line has a form of grid.

Optionally, a difference between the width of the dummy data line and the width of the effective data line is greater than 0.5 μm and less than or equal to 68 μm.

Optionally, the width of the dummy data line is greater than 2.5 μm and less than or equal to 70 μm.

Optionally, the width of the dummy data line is greater than 10 μm and less than or equal to 20 μm.

Optionally, the dummy data line includes a plurality of metal lines intersecting with each other.

Optionally, a width of each of the metal lines is equal to or greater than the width of the effective data line.

Optionally, at least one of a material of the dummy data line and a material of the effective data line is selected from at least one of Mo, Al, Ti, Au, Cu, Hf and Ta.

Optionally, the array substrate may further include a planarization layer disposed over the dummy data line and the effective data line.

In another aspect, it is provided a display panel including the array substrate as mentioned above.

In a further aspect, it is provided a display device including the display panel as mentioned above.

In another further aspect, it is provided a method for manufacturing an array substrate, including:

providing a base substrate including a display area and a non-display area; and forming a dummy data line and an effective data line in the non-display area of the base substrate, wherein the dummy data line is closer to an edge of the base substrate than the effective data line, and a width of the dummy data line is greater than a width of the effective data line.

Optionally, forming the dummy data line and the effective data line in the non-display area of the base substrate may include:

forming the dummy data line and the effective data line in the non-display area of the base substrate through one patterning process.

Optionally, forming the dummy data line and the effective data line in the non-display area of the base substrate through one patterning process may include:

forming a conductive material layer on the base substrate;

forming a photoresist layer on the conductive material layer;

exposing the photoresist layer by using a mask;

developing the exposed photoresist layer; and etching the conductive material layer through a dry etching process to form the dummy data line and the effective data line.

Optionally, the mask includes a first portion for forming the dummy data line and a second portion for forming the effective data line, and a width of the first portion is greater than a width of the second portion.

Optionally, the first portion includes a plurality of first sub-portions, the plurality of first sub-portions intersecting with each other to form a grid.

Optionally, a difference between the width of the dummy data line and the width of the effective data line is greater than 0.5 μm and less than or equal to 68 μm.

Optionally, the width of the dummy data line is greater than 2.5 μm and less than or equal to 70 μm.

Optionally, the width of the dummy data line is greater than 10 μm and less than or equal to 20 μm.

Optionally, the method may further include: forming a planarization layer over the dummy data line and the effective data line.

BRIEF DESCRIPTION OF THE DRAWINGS

In order to more clearly describe technical solutions of embodiments of the present disclosure, accompanying drawings to be used in the description of the embodiments of the present disclosure will be briefly described below. It is obvious that the drawings in the following description are only some embodiments of the present disclosure. Other drawings may also be obtained from those skilled in the art based on these drawings without creative work.

DETAILED DESCRIPTION OF EMBODIMENTS

Objects, features and advantages of the present disclosure will become more apparent by describing the present disclosure in detail below with reference to accompanying drawings and specific embodiments.

Figure 1:
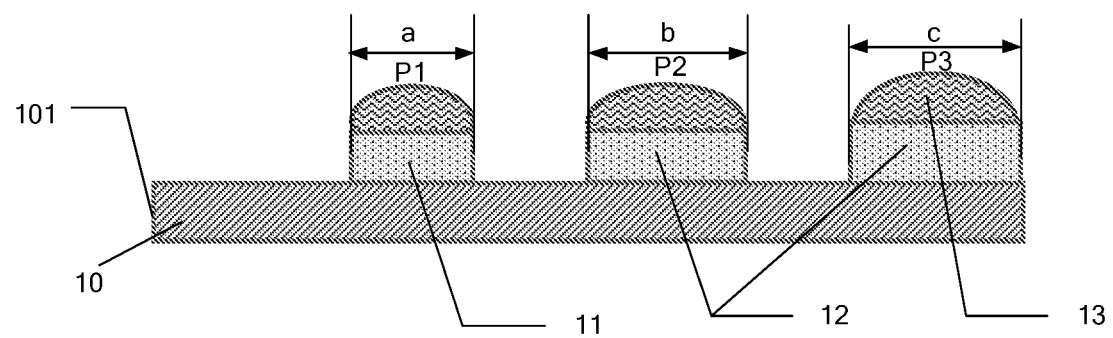
FIG. 1 is a cross-sectional structural view showing a non-display area of an array substrate in the related art.

In the related art, referring to FIG. 1, an array substrate includes a base substrate 10, a dummy data line 11 and effective data lines 12. The dummy data line 11 and the effective data lines 12 are disposed at positions close to an edge 101 of the base substrate 10. A designed width of the dummy data line 11 is equal to a designed width of each effective data line 12. The inventors have found that there may be the following problem in a process of manufacturing an array substrate with such a structure: photoresists 13 at the positions close to the edge 101 of the base substrate are easily overexposed during an exposure process so that the photoresists 13 which are actually remained after a development process become narrower as they become closer to the edge 101. For example, FIG. 1 shows the photoresists 13 at three positions. For convenience of description, the photoresists 13 at three positions are referred to as the photoresist 13 at a first position P1, the photoresist 13 at a second position P2 and the photoresist 13 at a third position P3, respectively. The first position P1, the second position P2 and the third position P3 are sequentially away from the edge 101. The photoresist 13 at the first position P1 has a first width a, the photoresist 13 at the second position P2 has a second width b, and the photoresist 13 at the third position P3 has a third width c. As shown, a<b<c. During a subsequent etching process, an over etching becomes more obvious as the data lines become closes to the edge 101. As a result, the width of the dummy data line 11 and the widths of the effective data lines 12 at the positions close to the edge 101 are further reduced. In a narrow-bezel product, because of small designed sizes, such as diameters or spaces or the like, of the dummy data line 11 and the effective data lines 12 as well as influences of the above-mentioned overexposure and over etching, defects such as weak connections, disconnections or the like are easy to occur in the manufactured dummy data line 11 and effective data lines 12.

Figure 2:
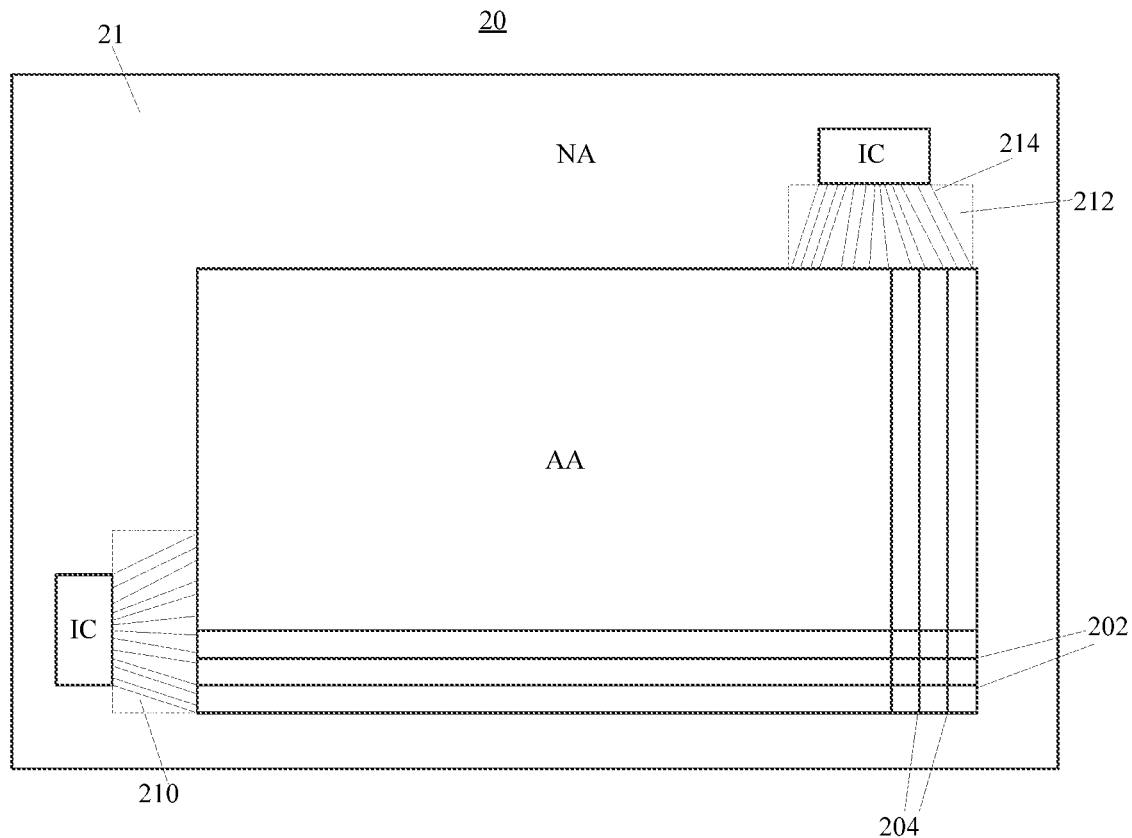
FIG. 2 is a schematic plan view of an array substrate according to an embodiment of the present disclosure.

FIG. 2 shows a schematic plan view of an array substrate according to an embodiment of the present disclosure. Referring to FIG. 2, the array substrate 20 includes a base substrate 21. The base substrate 21 may include a display area (also referred to as active area) AA and a non-display area NA surrounding the display area. For example, a plurality of pixels are disposed in the display area AA to form a pixel array, and peripheral circuits such as a gate driving circuit, a source driving circuit and the like are disposed in the non-display area NA. Each pixel may include a thin film transistor and a pixel electrode connected to the thin film transistor, and each pixel is enclosed by two adjacent scan lines 202 and two adjacent data lines 204. The scan lines 202 and the data lines 204 extend from the display area AA to the non-display area NA, and are electrically connected to driving chips (ICs) through the peripheral circuits, respectively. The peripheral circuits converge from an end connecting with the scan lines 202 or the data lines 204 towards an area where the driving chips (ICs) are located so as to form fanout circuits. As shown in FIG. 2, a wiring structure connecting the plurality of scan lines 202 to the driving chip may be referred to as a gate fanout circuit 210, and a wiring structure connecting the plurality of data lines 204 to the driving chip may be referred to as a source fanout circuit 212.

Taking the source fanout circuit 212 as an example, the source fanout circuit 212 includes a plurality of fanout circuit data lines 214 which are electrically connected to the data lines 204. For convenience of description, the fanout circuit data lines 214 are also referred to data lines 214 herein. In order to facilitate manufacturing the data lines, at least one data line 214 at a position close to the edge of the base substrate 21 is taken as a dummy data line, and the other data lines 214 are taken as effective data lines.

Figure 3:
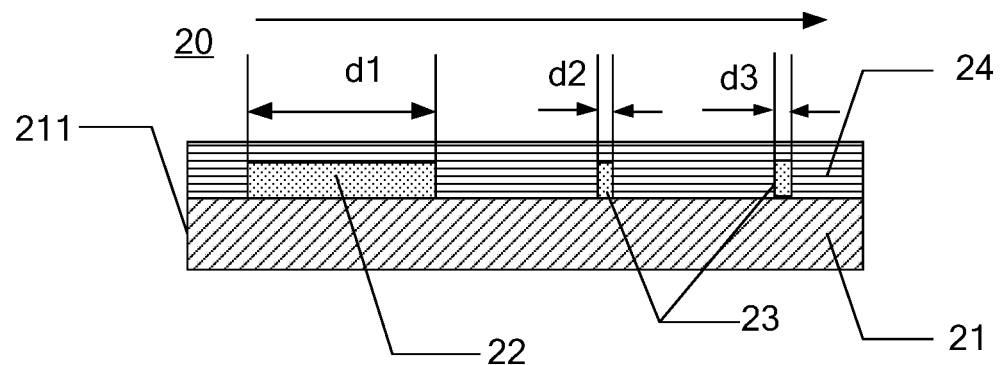
FIG. 3 is a schematic cross-sectional view of a non-display area of an array substrate according to an embodiment of the present disclosure.

FIG. 3 illustrates a cross-sectional view of an array substrate according to an embodiment of the present disclosure. Referring to FIG. 2 and FIG. 3, the array substrate 20 may include a base substrate 21 including a display area AA and a non-display area NA. FIG. 3 mainly shows a cross-sectional structure of the non-display area NA of the array substrate 20. The array substrate 20 may further include a dummy data line 22 and effective data lines 23. The dummy data line 22 and the effective data lines 23 are disposed in the non-display area of the base substrate 21, and the dummy data lines 22 is closer to an edge 211 of the base substrate 21 than the effective data lines 23.

As shown, a width of the dummy data line 22 is greater than a width of each of the effective data lines 23. Specifically, as shown in FIG. 3, the dummy data line 22 which is disposed near the edge 211 of the non-display area of the base substrate 21 has a width d1, and two effective data lines 23 which are disposed near the dummy data line 22 have widths d2, d3, respectively. In one example, d1>d2 and d2=d3.

With such a design, the widened dummy data line 22 may absorb excessive energy at positions near the edge 211 during an exposure process, thereby effectively avoiding too thin dummy data line 22 and effective data lines 23 due to the overexposure. Moreover, during an etching process, the widened dummy data line 22 may also absorb excessive particles at the positions near the edge 211, thereby further avoiding the too thin dummy data lines 22 and effective data lines 23 due to over etching. Therefore, a possibility of defects such as line disconnections in the manufacturing process may be reduced and the product yield may be improved.

It should be noted that the edge 211 of the non-display area is also an edge of the array substrate or an edge of the base substrate, and a direction indicated by an arrow in FIG. 3 is a direction from the non-display area to the display area.

For example, the width of the dummy data line 22 may be determined according to factors such as the widths of the effective data lines 23, and a size of a blank area between the edge 211 of the non-display area and the dummy data line 22 and the like. For example, a difference between the width of the dummy data line 22 and the width of the effective data line 23 may be greater than 0.5 μm and less than or equal to 68 μm. For example, the width of the effective data line may be about 2 μm, and the width of the dummy data line 22 may be greater than 2.5 μm and less than or equal to 70 μm. Alternatively, the width of the dummy data lines 22 may be greater than 10 μm and less than or equal to 20 μm.

A material of the dummy data line 22 and/or a material of the effective data lines 23 may be one selected from a group of metal materials having high conductivity, such as Mo, Al, Ti, Au, Cu, Hf and Ta.

Still referring to FIG. 3, the array substrate 20 may further include a planarization layer 24 disposed over the dummy data line 22 and the effective data lines 23. The planarization layer 24 may cover the dummy data line 22 and the effective data lines 23. By setting the planarization layer 24, a pad area may be planarized to facilitate subsequent packaging.

Figure 4:
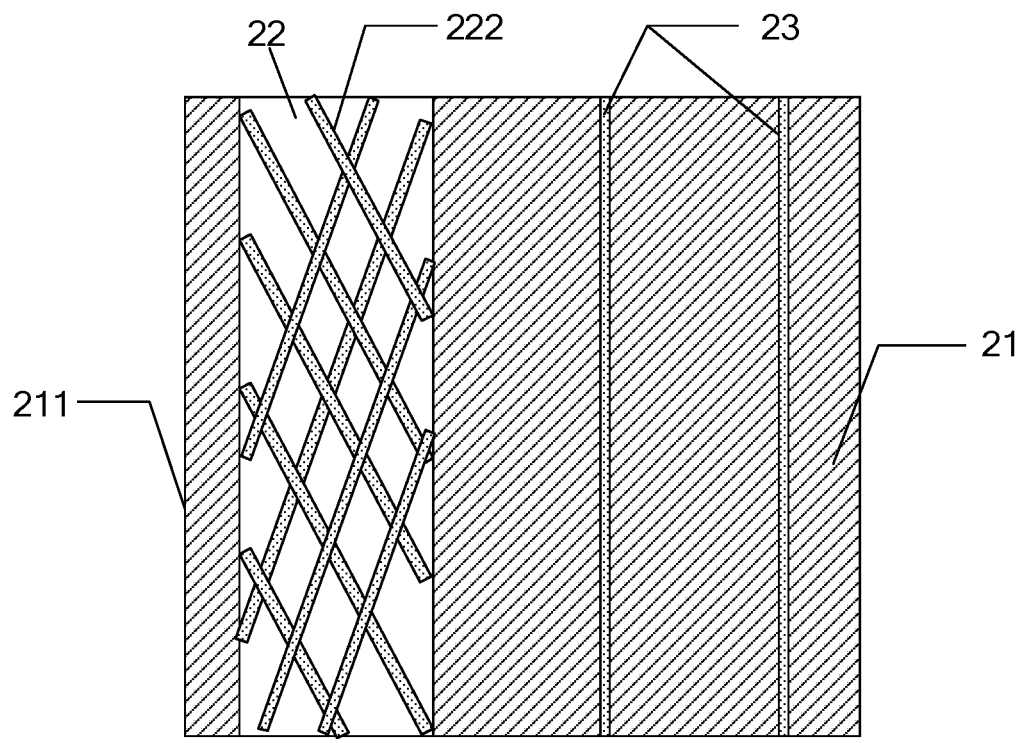
FIG. 4 is a schematic plan view of a non-display area of an array substrate according to an embodiment of the present disclosure.

FIG. 4 is a schematic plan view showing the array substrate of FIG. 3, in which the planarization layer 24 is omitted in order to show the data lines. As shown, the dummy data line 22 may be in a form of grid. Specifically, the dummy data line 22 may include a plurality of metal lines 222 which intersect with each other to form a grid. Optionally, a width of each of the metal lines 222 may be substantially equal to or slightly larger than the width of the effective data line 23. For example, the width of the effective data line may be about 2 μm, the width of each of the metal lines 222 may be about 2 μm, alternatively the width of each of the metal lines 222 may be about 2.5 μm. Of course, the width of each of the metal lines 222 may be greater than the width of the effective data line 23. For example, the width of each of the metal lines 222 may be greater than 2.5 μm. In this way, during the etching process, the grid-shaped dummy data line 22 may further limit the excessive particles at the positions near the edge in the grid, thereby effectively avoiding the over etching due to bounces of the particles.

Figure 5:
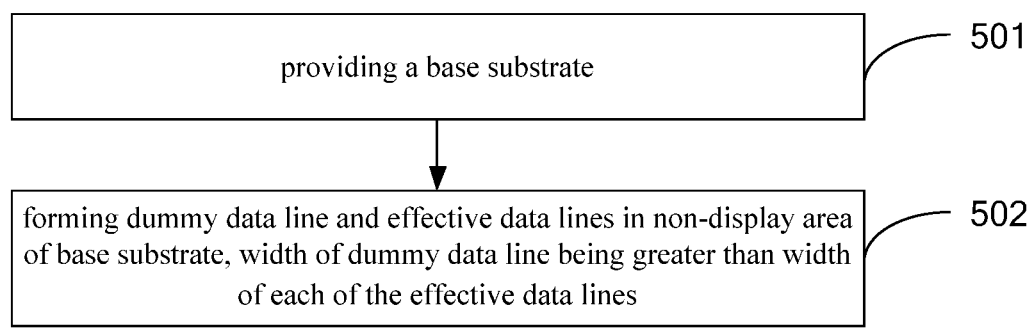
FIG. 5 is a flow chart of a method for manufacturing an array substrate according to an embodiment of the present disclosure.

According to another embodiment of the present disclosure, a method for manufacturing an array substrate is provided. Referring to FIG. 5, the method may include:

step 501: providing a base substrate 21, the base substrate 21 including a display area AA and a non-display area NA; and step 502: forming a dummy data line 22 and effective data lines 23 in the non-display area NA of the base substrate 21, a width of the dummy data line 22 being greater than a width of each of the effective data lines 23.

Specifically, the base substrate may be a glass substrate or a flexible substrate, and the array substrate may further include structures formed on the glass substrate or the flexible substrate, such as a gate line layer, an insulating layer and the like. Specific Structures of array substrate are not limited in the embodiments of the present disclosure.

Optionally, the step 502 may include: forming the dummy data line 22 and the effective data lines 23 in the non-display area NA of the base substrate 21 through one patterning process. In the embodiment, the dummy data line and the effective data lines are formed through one patterning process so that quantity of patterning processes is not increased, which is advantageous for reducing the manufacturing cost.

Figure 6A:
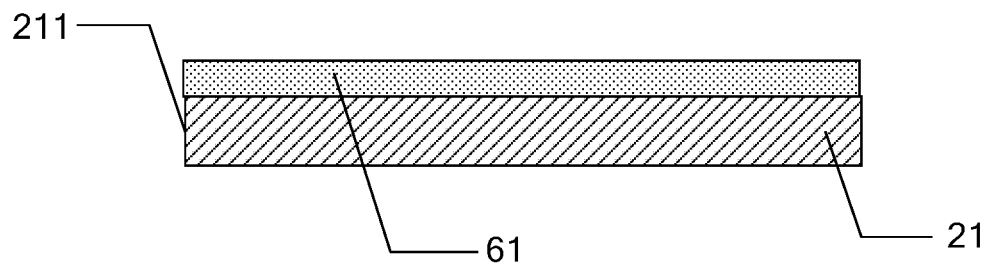
FIGS. 6A to 6E respectively illustrate structures formed after various steps of a method for manufacturing an array substrate according to an embodiment of the present disclosure.

Specifically, referring to FIG. 6A, a conductive material layer 61 is formed on the base substrate 21. The material of the conductive material layer 61 may be one selected from metal materials having high conductivity such as Mo, Al, Ti, Au, Cu, Hf and Ta.

Figure 6B:
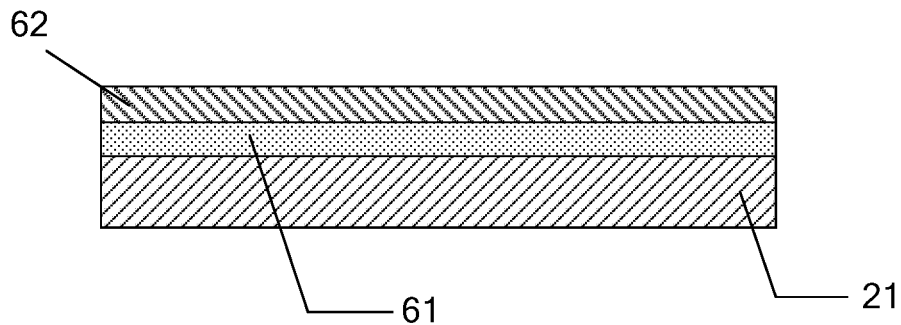

Referring to FIG. 6B, a photoresist layer 62 is formed on the conductive material layer 61. The photoresist layer 62 may include a positive photoresist or a negative photoresist.

Figure 6C:
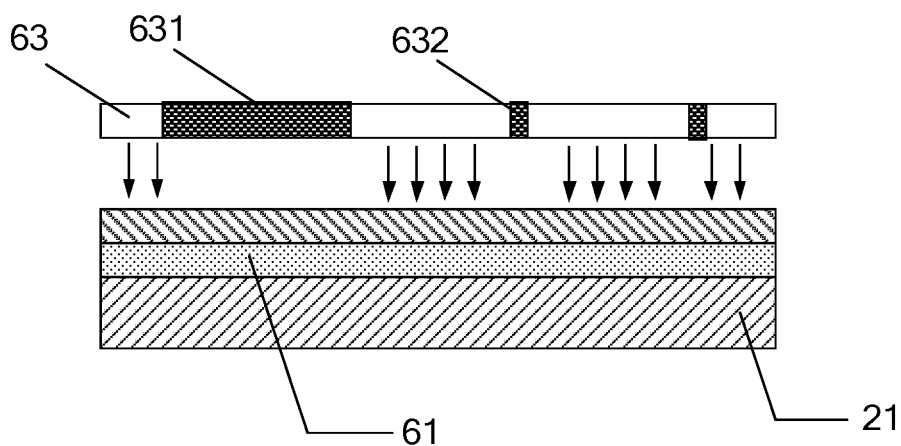
Figure 7:
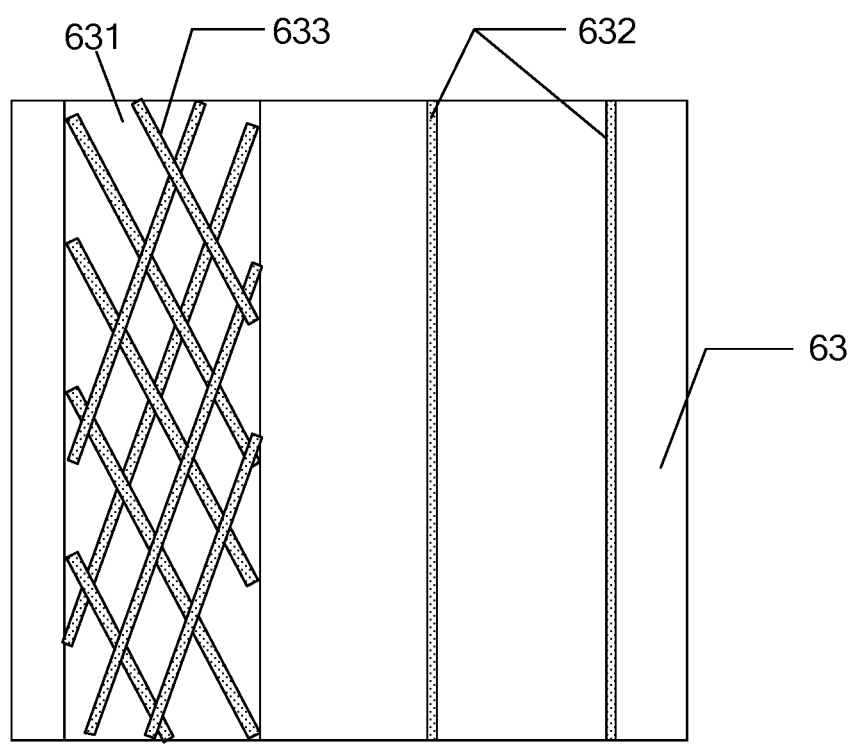
FIG. 7 is a schematic plan view of a mask used in a method for manufacturing an array substrate according to an embodiment of the present disclosure.

Referring to FIG. 6C, the photoresist layer 62 is exposed by using a mask 63. As shown in FIG. 7, the mask 63 may include a first portion 631 corresponding to the dummy data line 22 to be formed and second portions 632 corresponding to the effective data lines 23 to be formed, that is, the first portion 631 is used to form the dummy data line 22 while the second portions 632 are used to form the effective data lines 23, and a width of the first portion 631 is greater than a width of each of the second portions 632 such that the width of the formed dummy data line 22 is greater than the width of each of the formed effective data lines 23. Optionally, a difference between the width of the first portion 631 and the width of each of the second portions 632 may be greater than 0.5 μm and less than or equal to 68 μm. For example, the width of the second portion 632 is about 2 μm, and the width of the first portion 631 may be greater than 2.5 μm and less than or equal to 70 μm. Optionally, the width of the first portion 631 may be greater than 10 μm and less than or equal to 20 μm.

Figure 6D:
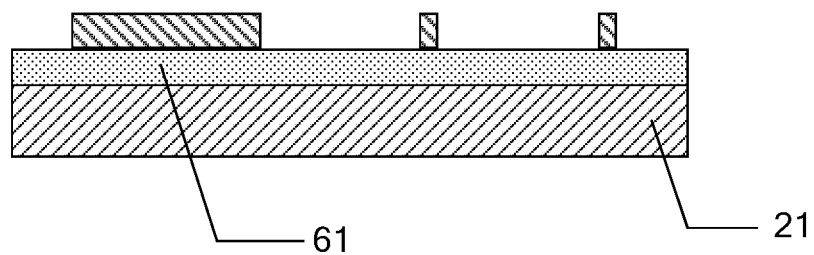

Referring to FIG. 6D, the photoresist layer 62 is developed.

Figure 6E:
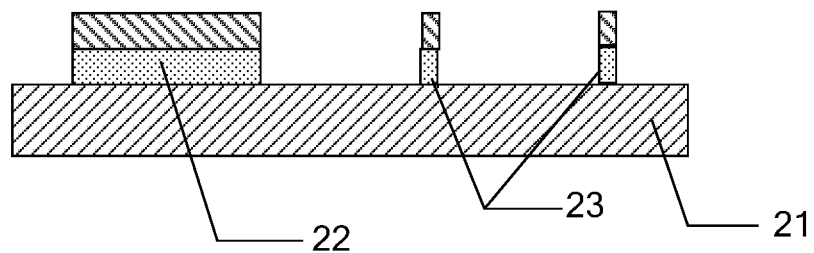

Referring to FIG. 6E, the conductive material layer 61 is etched through a dry etching process to form a dummy data line 22 and effective data lines 23. In the dry etching process, the conductive material layer 61 is etched by using plasma. After the etching process is completed, the remaining photoresist may be removed.

Referring again to FIG. 7, for example, the first portion 631 of the mask 63 may include a plurality of first sub-portions 633 which intersect with each other to form a grid such that the formed dummy data line 22 have a form of grid. In this way, in the subsequent etching process, the grid-shaped dummy data line 22 may limit the particles (i.e., plasma) at the positions near the edge in the grid, thereby effectively avoiding the over etching due to bounces of the particles.

Optionally, a width of each of the first sub-portions 633 may be substantially equal to or slightly greater than the width of each of the second portions 622. For example, the width of each of the second portions 622 may be about 2 μm, the width of each of the first sub-portions 633 may be about 2 μm, or the width of each of the first sub-portions 633 may be about 2.5 μm. Of course, the width of each of the first sub-portions 633 may also be greater than the width of each of the second portions 622. For example, the width of each of the first sub-portions 633 may be greater than 2.5 μm. In this way, the size of each sub-portion is in the same scale as that of each second portion 622 so that it is not necessary to increase a manufacturing accuracy for the mask, which is advantageous for the manufacture of the mask.

In order to planarize the non-display area and facilitate subsequent packaging, the above method may further include: forming a planarization layer 24 over the dummy data line 22 and the effective data lines 23. For example, the planarization layer 24 may cover the dummy data lines 22 and the effective data lines 23.

Figure 8:
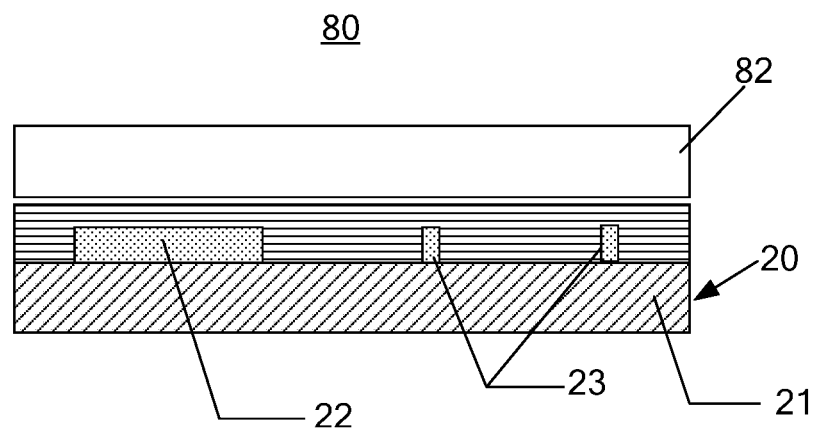
FIG. 8 is a schematic view of a display panel according to an embodiment of the present disclosure.

According to a further embodiment of the present disclosure, a display panel is provided. The display panel may include the array substrate described in any of the above embodiments. As shown in FIG. 8, the display panel 80 may include an array substrate 20 and an opposite substrate 82 disposed opposite to the array substrate 20. It can be understood that the display panel 80 may be a liquid crystal display panel, an OLED display panel or a QLED display panel.

Figure 9:
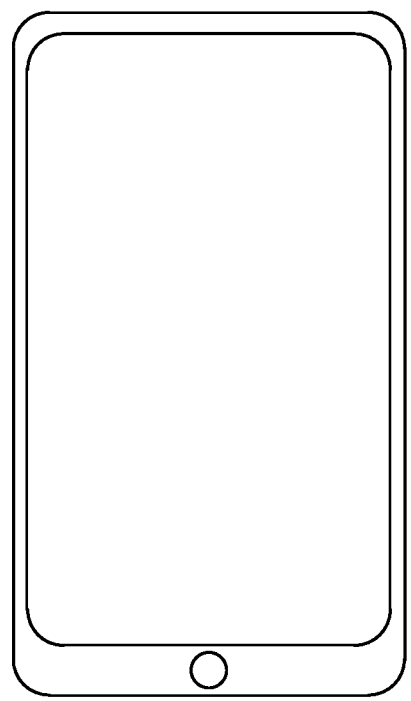
FIG. 9 is a schematic view of a display device according to an embodiment of the present disclosure.

According to still another embodiment of the present disclosure, a display device is further provided. The display device may include the above display panel, as shown in FIG. 9. The display device may be any product or component having a display function, such as a mobile phone, a tablet computer, a television, a display, a notebook computer, a digital camera, a navigator, a smart watch, a fitness wristband, a personal digital assistant, and the like.

In a method for manufacturing an array substrate, an array substrate, a display panel, and a display device according to embodiments of the present disclosure, the dummy data line and the effective data lines are disposed on the base substrate of the array substrate, and the width of the dummy data line is greater than the width of each of the effective data lines, by providing the wider dummy data line at the positions near the edge to absorb excessive energy or particles generated at the positions near the edge during the exposure and etching processes, it is possible to effectively protect the dummy data line and the effective data lines at the positions near the edge from being overexposed or over-etched, so as to reduce defects such as the line disconnections or the like during the manufacturing process and improve the product yield.

Optionally, the dummy data line 22 may be a dummy source connection line, and the effective data line 23 may be a source/drain connection line located in the fanout circuit area, or may be, for example, a touch signal line disposed in the same layer as the gate scan line. However, the present disclosure is not limited to the dummy data line and the effective data line listed above, and any other type of data lines may fall within the protection scope of the embodiments of the present disclosure.

The various embodiments in the present specification are described in a progressive manner, and each embodiment focuses on differences from the other embodiments, and the same or similar parts among the various embodiments may be referred to each other.

It should also be noted that in this context, relational terms such as first, second and the like are used merely to distinguish one entity or operation from another entity or operation, and do not necessarily require or imply that there is such actual relationship or order among these entities or operations. Furthermore, the terms "comprise", "comprising", "include", "including" or any other variants are intended to include non-exclusively some elements so that a process, a method, a product or an equipment including a series of elements may not only include these elements, but also include other elements which are not definitely listed, or also include elements which are inherent to the process, the method, the product or the equipment. Unless otherwise restricted, elements defined by the phrase "comprising a . . . " does not exclude the presence of additional elements in the process, method, product or equipment that comprises the elements.

The method for manufacturing an array substrate, the array substrate, the display panel, and the display device provided by the present disclosure are described in detail above. In the context, the principles and implementations of the present disclosure are described by using specific embodiments, and the descriptions of the above embodiments are only used to help understand the present disclosure and its inventive concept. Meanwhile, those skilled in the art may make changes to the specific embodiments and application ranges according to the concept of the present disclosure. Therefore, the contents of the specification are not to be construed as limiting the present disclosure.

What is claimed is:

1. An array substrate comprising:
    a base substrate comprising a display area and a non-display area;
    a dummy data line in the non-display area of the base substrate; and
    an effective data line in the non-display area of the base substrate,
    wherein the dummy data line is closer to an edge of the base substrate than the effective data line, and a width of the dummy data line is greater than a width of the effective data line,
    wherein the effective data line extends in a first direction, the dummy data line is spaced apart from the effective data line in a second direction, and the first direction is perpendicular to the second direction, and
    wherein the dummy data line comprises a plurality of metal lines intersecting with each other, a first part of the metal lines extend in a third direction, a second part of the metal lines extend in a fourth direction, the third direction intersects with the fourth direction, and both the third direction and the fourth direction intersect with each of the first direction and the second direction.

2. The array substrate according to claim 1, wherein a difference between the width of the dummy data line and the width of the effective data line is greater than 0.5 μm and less than or equal to 68 μm.

3. The array substrate according to claim 1, wherein the width of the dummy data line is greater than 2.5 μm and less than or equal to 70 μm.

4. The array substrate according to claim 3, wherein the width of the dummy data line is greater than 10 μm and less than or equal to 20 μm.

5. The array substrate according to claim 1, wherein a width of each of the metal lines is equal to or greater than the width of the effective data line.

6. The array substrate according to claim 1, wherein at least one of a material of the dummy data line and a material of the effective data line is selected from at least one of Mo, Al, Ti, Au, Cu, Hf and Ta.

7. The array substrate of claim 1, further comprising: a planarization layer disposed over the dummy data line and the effective data line.

8. A display panel comprising the array substrate according to claim 1.

9. A display device comprising the display panel according to claim 8.

10. A method for manufacturing an array substrate, comprising:
    providing a base substrate comprising a display area and a non-display area; and
    forming a dummy data line and an effective data line in the non-display area of the base substrate,
    wherein the dummy data line is closer to an edge of the base substrate than the effective data line, and a width of the dummy data line is greater than a width of the effective data line,
    wherein the effective data line extends in a first direction, the dummy data line is spaced apart from the effective data line in a second direction, and the first direction is perpendicular to the second direction, and
    wherein the dummy data line comprises a plurality of metal lines intersecting with each other, a first part of the metal lines extend in a third direction, a second part of the metal lines extend in a fourth direction, the third direction intersects with the fourth direction, and both the third direction and the fourth direction intersect with each of the first direction and the second direction.

11. The method according to claim 10, wherein forming the dummy data line and the effective data line in the non-display area of the base substrate comprises:
    forming the dummy data line and the effective data line in the non-display area of the base substrate through one patterning process.

12. The method according to claim 11, wherein forming the dummy data line and the effective data line in the non-display area of the base substrate through one patterning process comprises:

forming a conductive material layer on the base substrate;
forming a photoresist layer on the conductive material layer;
exposing the photoresist layer by using a mask;
developing the exposed photoresist layer; and
etching the conductive material layer through a dry etching process to form the dummy data line and the effective data line.

13. The method according to claim 12, wherein the mask comprises a first portion for forming the dummy data line and a second portion for forming the effective data line, and a width of the first portion is greater than a width of the second portion.

14. The method according to claim 13, wherein the first portion comprises a plurality of first sub-portions, the plurality of first sub-portions intersecting with each other to form a grid.

15. The method according to claim 10, wherein a difference between the width of the dummy data line and the width of the effective data line is greater than 0.5 μm and less than or equal to 68 μm.

16. The method according to claim 10, wherein the width of the dummy data line is greater than 2.5 μm and less than or equal to 70 μm.

17. The method according to claim 16, wherein the width of the dummy data line is greater than 10 μm and less than or equal to 20 μm.

18. The method according to claim 10, further comprising: forming a planarization layer over the dummy data line and the effective data line.

* * * * *